United States Patent
Zhang

(10) Patent No.: US 10,818,801 B2
(45) Date of Patent: Oct. 27, 2020

(54) THIN-FILM TRANSISTOR AND MANUFACTURING METHOD THEREOF

(71) Applicant: Shenzhen China Star Optoelectronics Technology Co., Ltd., Shenzhen (CN)

(72) Inventor: Qianyi Zhang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/967,195

(22) Filed: Apr. 30, 2018

(65) Prior Publication Data

US 2019/0207031 A1  Jul. 4, 2019

Related U.S. Application Data

(63) Continuation of application No. PCT/CN2018/073922, filed on Jan. 24, 2018.

(30) Foreign Application Priority Data

Dec. 29, 2017 (CN) .......................... 2017 1 1498511

(51) Int. Cl.
    *H01L 29/786* (2006.01)
    *H01L 21/02* (2006.01)
    *H01L 29/66* (2006.01)

(52) U.S. Cl.
    CPC .... *H01L 29/7869* (2013.01); *H01L 21/02554* (2013.01); *H01L 29/66969* (2013.01); *H01L 29/78696* (2013.01)

(58) Field of Classification Search
    None
    See application file for complete search history.

(56) References Cited

U.S. PATENT DOCUMENTS

| 7,868,322 B2 | 1/2011 | Kim et al. | |
|---|---|---|---|
| 2012/0001167 A1* | 1/2012 | Morosawa | H01L 29/7869 257/43 |
| 2012/0286262 A1 | 11/2012 | Jun et al. | |

FOREIGN PATENT DOCUMENTS

| CN | 102637591 A | 8/2012 |
|---|---|---|
| CN | 104272461 A | 1/2015 |
| WO | WO-2013167374 A1 * | 11/2013 |

* cited by examiner

*Primary Examiner* — Raj R Gupta
(74) *Attorney, Agent, or Firm* — Brinks Gilson & Lione

(57) ABSTRACT

A manufacturing method of a thin-film transistor is provided. The method include: forming a gate pattern layer on a substrate; forming a gate insulating layer covering the gate pattern layer; depositing semi-conductive oxide material on the gate insulating layer to form an active pattern layer on the gate insulating layer; depositing reducing material on the active pattern layer to form a reducing pattern layer; and forming a source pattern layer and a drain pattern layer on the reducing pattern layer. A thin-film transistor is further provided.

5 Claims, 4 Drawing Sheets

THIN-FILM TRANSISTOR AND MANUFACTURING METHOD THEREOF

CROSS-REFERENCE TO RELATED APPLICATIONS

The present application is a continuation-application of International (PCT) Patent Application No. PCT/CN2018/073922 filed Jan. 24, 2018, which claims foreign priority of Chinese Patent Application No. 201711498511.0, filed on Dec. 29, 2017 in the State Intellectual Property Office of China, the entire contents of which are hereby incorporated by reference.

TECHNICAL FIELD

The present disclosure relates to the display technology, and more particular, to a thin-film transistor and a manufacturing method thereof.

BACKGROUND

Compared with amorphous silicon, IGZO (Indium Gallium Zinc Oxide) gains extensive attentions since it has advantages of having a higher mobility and a lower deposition temperature. In a thin-film transistor of back channel etching type, a barrier layer is generally made from metal, such as molybdenum, molybdenum-titanium alloy, or the like. The barrier layer is arranged between an active pattern layer made from the IGZO and a source pattern layer, or between the active pattern layer and a drain pattern layer. However, during the etching process, molybdenum residuals are existed, and acids containing fluorine and copper which greatly pollute the environment need to be used. Meanwhile, level defects are occurred since there are plenty of weak-oxygen bonds or oxygen vacancies at contact interfaces between back channels made from IGZO and the metals; in this way, the number, motion trajectories and mobility of carriers in the back channels will be affected.

SUMMARY

A thin-film transistor and a manufacturing method thereof are provided in the present disclosure, in order to solve the technical problems that the number, motion trajectories and mobility of carriers in the back channels are affected due to the weak-oxygen bonds or the oxygen vacancies existed in the semi-conductive oxide material.

In order to solve the technical problem above, a technical solution is adopted in the present disclosure. Wherein a manufacturing method of a thin-film transistor is provided, which comprises: forming a gate pattern layer on a substrate; forming a gate insulating layer covering the gate pattern layer; depositing semi-conductive oxide material on the gate insulating layer to form an active pattern layer on the gate insulating layer; depositing reducing material on the active pattern layer to form a reducing pattern layer, and the reducing material comprising potassium or calcium; and forming a source pattern layer and a drain pattern layer on the reducing pattern layer; wherein depositing the reducing material on the active pattern layer to form the reducing pattern layer comprises: depositing the reducing material on the active pattern layer by means of a thermal evaporation process to form the reducing pattern layer; and annealing the reducing pattern layer.

In order to solve the technical problem above, another technical solution is adopted in the present disclosure. Wherein a manufacturing method of a thin-film transistor is provided, which comprises: forming a gate pattern layer on a substrate; forming a gate insulating layer covering the gate pattern layer; depositing semi-conductive oxide material on the gate insulating layer to form an active pattern layer on the gate insulating layer; depositing reducing material on the active pattern layer to form a reducing pattern layer; and forming a source pattern layer and a drain pattern layer on the reducing pattern layer.

In order to solve the technical problem above, in a further aspect, a further technical solution is adopted in the present disclosure. Wherein a thin-film transistor is provided, which comprises: a gate pattern layer formed on a substrate; a gate insulating layer covering the gate pattern layer; an active pattern layer formed on the gate insulating layer; a reducing pattern layer formed on the active pattern layer; and a source pattern layer and a drain pattern layer formed on the reducing pattern layer.

The present disclosure may have the following advantages: compared with the related art, a gate pattern layer may be formed on a substrate; a gate insulating layer covering the gate pattern layer may be formed; semi-conductive oxide material may be deposited on the gate insulating layer to form an active pattern layer; reducing material may be deposited on the active pattern layer to form a reducing pattern layer; and a source pattern layer and a drain pattern layer may be formed on the reducing pattern layer. In this way, the reducing material in the reducing pattern layer may be combined with the weak-oxygen bonds on the surfaces of the back channels of the active pattern layer formed by semi-conductive oxides, and the electrons in the reducing material may be transited to the surfaces of the active pattern layer and thus an electron accumulation layer is formed. Therefore, the level defects of the back channels of the active pattern layer may be reduced, and the mobility may be improved.

BRIEF DESCRIPTION OF THE DRAWINGS

In order to make the technical solution of embodiments of the present disclosure more clearly, drawings used for the description of the embodiments will be briefly described. Apparently, the drawings described above are only some exemplary embodiments of the present disclosure. One skilled in the art may acquire other drawings based on these drawings without any inventive work. In the drawings.

DETAILED DESCRIPTION

The technical solution of the embodiments of the present disclosure will be described more clearly and completely with reference to the accompanying drawings. Apparently, the embodiments described here only some exemplary embodiments, not all the embodiments. Based on the embodiments described in the present disclosure, one skilled in the art may acquire all other embodiments without any creative work. All these shall be covered within the protection scope of the present disclosure.

Figure 1:
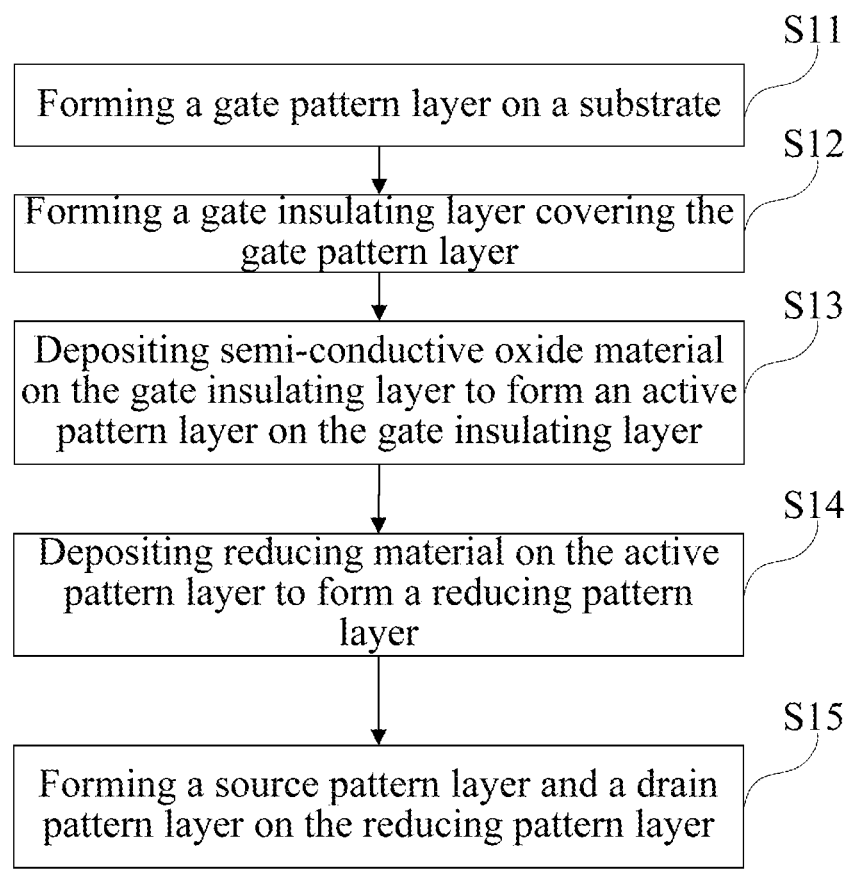
FIG. 1 is a flow chart of a manufacturing method of a thin-film transistor according to one embodiment of the present disclosure.
Figure 2:
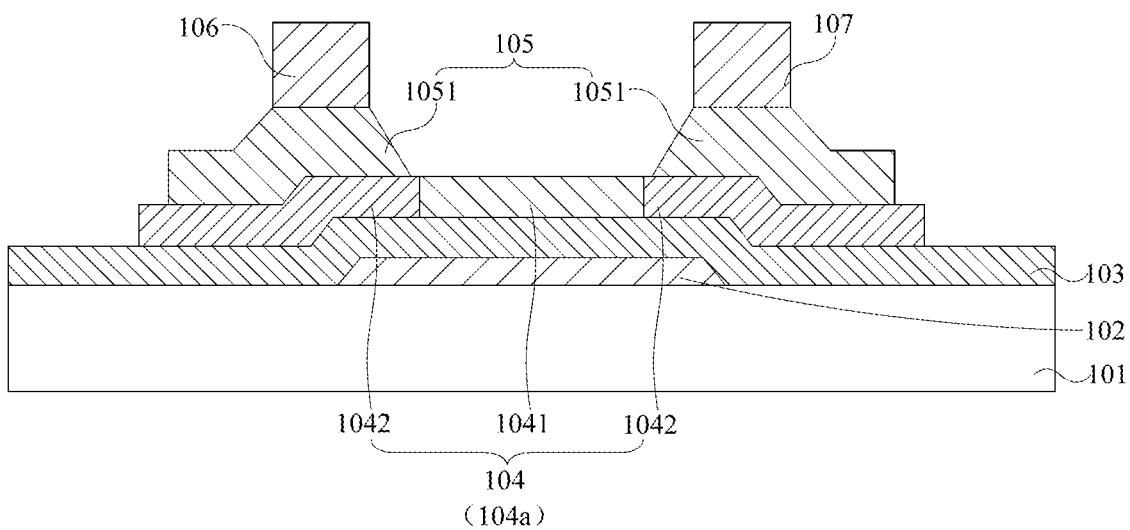
FIG. 2 is a structural view of the thin-film transistor according to one embodiment of the present disclosure.

FIG. 1 illustrates a flow chart of a manufacturing method of a thin-film transistor according to one embodiment of the present disclosure, and FIG. 2 illustrates a structural view of the thin-film transistor according to one embodiment of the present disclosure. Referring to FIG. 1 and FIG. 2, the manufacturing method of the present embodiment may substantially include the following blocks.

At block S11: a gate pattern layer may be formed on a substrate.

More specifically, a first conductive layer may be firstly formed by depositing first metal material on the substrate 101 by means of a physical vapor deposition method. Then the first conductive layer may be patterned by photolithography processes including for example photoresist coating, exposure, development, etching, and the like. In this way, the gate pattern layer 102 may be formed.

Optionally, the first metal material may include at least one material selecting from a group comprising but not limit to titanium, aluminum and copper. For example, it is possible to form the first conductive layer by successively depositing a titanium film having a thickness of approximately 20 nm~50 nm and a copper film having a thickness of approximately 100 nm~400 nm on the substrate 101.

Optionally, the substrate 101 may include but not limit to a glass substrate or a ceramic substrate.

At block S12: a gate insulating layer covering the gate pattern layer may be formed.

More specifically, the gate insulating layer 103 may be formed by depositing insulating material covering the gate pattern layer 102 on the substrate 101 by means of a chemical vapor deposition method.

Optionally, the insulating material may include at least one material selecting from a group comprising silicon oxide and silicon nitride. For example, it is possible to form the gate insulating layer 103 by successively depositing a silicon nitride film having a thickness of approximately 200 nm~400 nm and a silicon oxide film having a thickness of approximately 10 nm~100 nm on the substrate 101. It is also possible to use a single-layer structure as the gate insulating layer 103. The single-layer structure may be formed by a silicon oxide film having a thickness of approximately 80 nm~250 nm, or formed by a silicon nitride film having a thickness of approximately 160 nm~450 nm.

At block S13: semi-conductive oxide material may be deposited on the gate insulating layer to form an active pattern layer.

Figure 3:
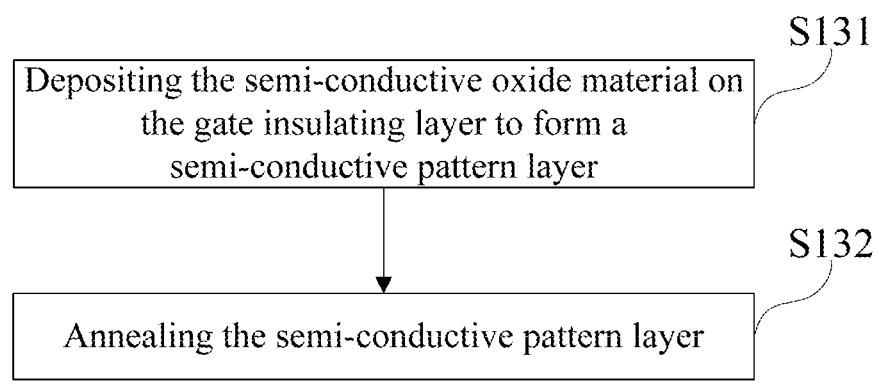
FIG. 3 is a specific flow chart of the block S13 shown in FIG. 1.

As shown in FIG. 3, the block S13 may specifically include the following blocks.

At block S131: the semi-conductive oxide material may be deposited on the gate insulating layer to form a semi-conductive pattern layer.

More specifically, a semi-conductive layer may be formed by depositing the semi-conductive oxide material on the gate insulating layer 103 by means of the physical vapor deposition method. Then the semi-conductive layer may be patterned by the photolithography processes including for example photoresist coating, exposure, development, etching, and the like. In this way, the semi-conductive pattern layer 104 may be formed.

In this embodiment, the semi-conductive pattern layer 104 may include a first semi-conductive pattern sub-layer 1041 and two second semi-conductive pattern sub-layers 1042. Wherein, the two second semi-conductive pattern sub-layers 1042 may be respectively arranged at two opposite sides of the first semi-conductive pattern sub-layer 1041, and adjacent to the first semi-conductive pattern sub-layer 1041. That is, the first semi-conductive pattern sub-layer 1041 is sandwiched between the two second semi-conductive pattern sub-layers 1042, and both the first semi-conductive pattern sub-layer 1041 and the two second semi-conductive pattern sub-layers 1042 for are formed on and in contact with the gate insulating layer 103.

Optionally, the semi-conductive oxide material may include IGZO (Indium Gallium Zinc Oxide) or IZO (Indium Zinc Oxide).

At block S132: the semi-conductive pattern layer may be annealed.

More specifically, the semi-conductive pattern layer 104 may be annealed by means of a hydrogen plasma annealing method or an argon plasma annealing method. In this way, during the annealing process, the two second semi-conductive pattern sub-layers 1042 each may have a conducting property and performed as a conductor, while the first semi-conductive pattern sub-layer 1041 may keep having a semi-conducting property and performed as a semi-conductor. The annealed semi-conductive pattern layer 104 may form the active pattern layer 104a.

At block S14: reducing material may be deposited on the active pattern layer to form a reducing pattern layer.

Figure 4:
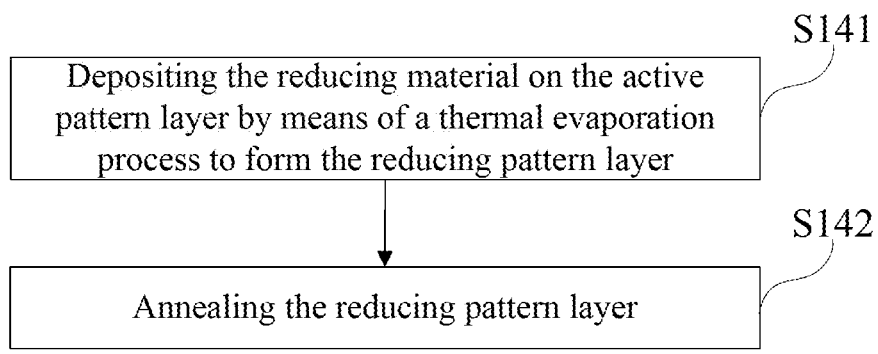
FIG. 4 is a specific flow chart of the block S14 shown in FIG. 1.

As shown in FIG. 4, the block S14 may specifically include the following blocks.

At block S141: the reducing material may be deposited on the active pattern layer by means of a thermal evaporation process to form the reducing pattern layer.

Figure 5:
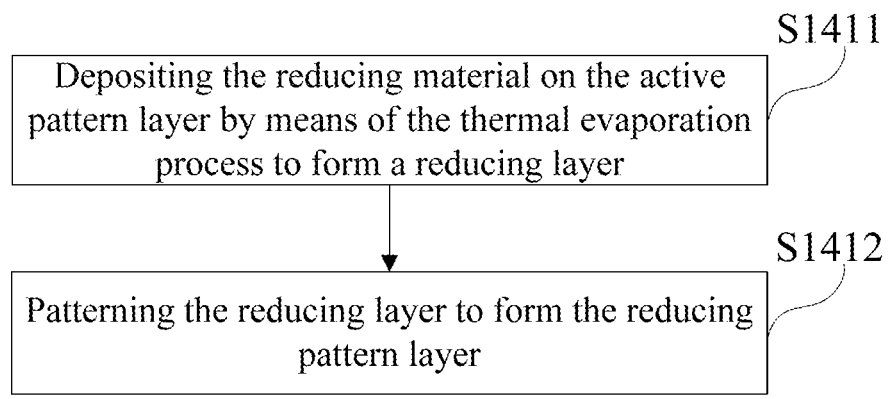
FIG. 5 is a specific flow chart of the block S141 shown in FIG. 4.

As shown in FIG. 5, the block S141 may specifically include the following blocks.

At block S1411: the reducing material may be deposited on the active pattern layer by means of the thermal evaporation process to form a reducing layer.

In this embodiment, the thermal evaporation process may be performed at a temperature of 200~400° C. for 60~150 min, by using nitrogen gas or oxygen gas. For example, in one embodiment, when using the nitrogen gas, the thermal evaporation process may be performed at a temperature of 280° C. for 100 min. In another embodiment, when using the oxygen gas, the thermal evaporation process may be performed at a temperature of 200° C. for 60 min.

Optionally, the reducing material may include potassium or calcium.

At block S1412: the reducing layer may be patterned to form the reducing pattern layer.

More specifically, after the reducing layer has been formed, the reducing layer may be patterned by the photolithography processes including for example photoresist coating, exposure, development, etching, and the like. In this way, the reducing pattern layer 105 may be formed.

In this embodiment, the reducing material may be the potassium or the calcium which has an active chemical property. In this way, during the patterning process described above, there is no need to use acids containing fluorine and copper. Thus, it is possible to reduce the pollution to the environment, and prevent the copper in the acids containing fluorine and copper from diffusing to the active pattern layer 104a which may affect the properties of the active pattern layer 104a.

Furthermore, the reducing pattern layer 105 may include two reducing pattern sub-layers 1051 respectively corresponding to the two second semi-conductive pattern sub-layers 1042. That is, the two reducing pattern sub-layers 1051 respectively formed on and connected to the two second semi-conductive pattern sub-layers 1042 one to one without any portion of the two reducing pattern sub-layers 1051 contacting with the first semi-conductive pattern sub-layer 1041. That is to say, no reducing pattern sub-layers are formed on the first semi-conductive pattern sub-layer.

Optionally, an area ratio of each reducing pattern sub-layer 1051 to each second semi-conductive pattern sub-layer 1042 may be in a range of ½~¾. For example, the area ratio of each reducing pattern sub-layer 1051 to each second semi-conductive pattern sub-layer 1042 may be 2:3 or 3:4.

At block S142: the reducing pattern layer may be annealed.

At block S15: a source pattern layer and a drain pattern layer may be formed on the reducing pattern layer.

Figure 6:
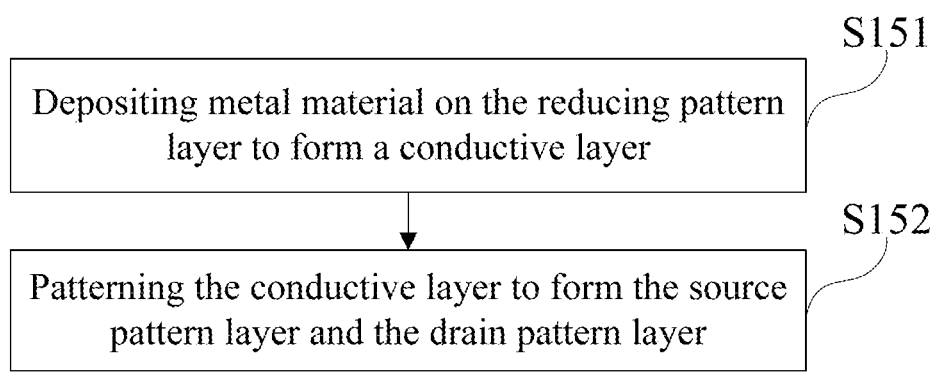
FIG. 6 is a specific flow chart of the block S15 shown in FIG. 1.

As shown in FIG. 6, the block S15 may specifically include the following blocks.

At block S151: second metal material may be deposited on the reducing pattern layer to form a second conductive layer.

More specifically, the second metal material may be deposited on the reducing pattern layer 105 by means of sputtering to form the second conductive layer. The second metal material may include but not limit to at least one material selected from a group comprising titanium, aluminum and copper. For example, it is possible to form the second conductive layer by successively sputtering a titanium film having a thickness of approximately 20 nm~50 nm and a copper film having a thickness of approximately 100 nm~400 nm on the reducing pattern layer 105.

At block S152: the second conductive layer may be patterned to form the source pattern layer and the drain pattern layer.

More specifically, the second conductive layer may be patterned by the photolithography processes including for example photoresist coating, exposure, development, etching, and the like. In this way, the source pattern layer 106 and the drain pattern layer 107 spaced from each other may be formed.

In this embodiment, the source pattern layer 106 and the drain pattern layer 107 may formed corresponding to the two reducing pattern sub-layers 1051, such that the two reducing pattern sub-layers 1051 may be respectively and electrically connected to the two second semi-conductive pattern sub-layers 1042 having the conducting property. In this way, the source pattern layer 106 and the drain pattern layer 107 may be respectively and electrically connected to the two second semi-conductive pattern sub-layers 1042 via the two reducing pattern sub-layers 1051.

Furthermore, in this embodiment, after forming the active pattern layer 104a using the IGZO or IZO at the above block S13, plenty of weak-oxygen bonds and oxygen vacancies may be formed on surfaces of back channels of the active pattern layer 104a. At the block S14, the reducing pattern layer 105 is formed by using the reducing material including potassium or calcium. In this embodiment, the potassium or the calcium has a strong reducibility, and may be diffused to the surfaces of the active pattern layer 104a and combined with the weak-oxygen bonds after getting into contact with the active pattern layer 104a; in this way, the level defects of the back channels of the active pattern layer 104a may be reduced, and the mobility may be improved. Besides, the potassium or the calcium has a low work function, and electrons in the potassium or the calcium may be transited to the surfaces of the active pattern layer 104a; in this way, an electron accumulation layer may be formed on the surfaces of the active pattern layer 104a, and thus it is possible to maintain the stability of threshold voltages. Furthermore, after oxides are formed due to the combination of the potassium or the calcium with the weak-oxygen bonds, it is also possible to prevent the second metal material in the source pattern layer 106 and the drain pattern layer 107 from permeating to the reducing pattern layer 105.

Referring to FIG. 2 further, in one embodiment of the present disclosure, the thin-film transistor may include a gate pattern layer 102 formed on a substrate 101, a gate insulating layer 103 covering the gate pattern layer 102, an active pattern layer 104a formed on the gate insulating layer 103, a reducing pattern layer 105 formed on the active pattern layer 104a, and a source pattern layer 106 and a drain pattern layer 107 formed on the reducing pattern layer 105.

In this embodiment, the reducing pattern layer 105 may be made from the potassium or the calcium.

In this embodiment, the semi-conductive pattern layer 104 may include a first semi-conductive pattern sub-layer 1041 and two second semi-conductive pattern sub-layers 1042. Wherein, the two second semi-conductive pattern sub-layers 1042 may be respectively arranged at two opposite sides of the first semi-conductive pattern sub-layer 1041, and adjacent to the first semi-conductive pattern sub-layer 1041. That is, the first semi-conductive pattern sub-layer 1041 is sandwiched between the two second semi-conductive pattern sub-layers 1042, and both the first semi-conductive pattern sub-layer 1041 and the two second semi-conductive pattern sub-layers 1042 for are formed on and in contact with the gate insulating layer 103.

Furthermore, the reducing pattern layer 105 may include two reducing pattern sub-layers 1051 respectively corresponding to the two second semi-conductive pattern sub-layers 1042. That is, the two reducing pattern sub-layers 1051 respectively formed on and connected to the two second semi-conductive pattern sub-layers 1042 one to one without any portion of the two reducing pattern sub-layers 1051 contacting with the first semi-conductive pattern sub-layer 1041. That is to say, no reducing pattern sub-layers are formed on the first semi-conductive pattern sub-layer.

Optionally, an area ratio of each reducing pattern sub-layer 1051 to each second semi-conductive pattern sub-layer 1042 may be in a range of ½~¾. For example, the area ratio of each reducing pattern sub-layer 1051 to each second semi-conductive pattern sub-layer 1042 may be 2:3 or 3:4.

It could be understood that, the above layers of the thin-film transistor of the present embodiment may be manufactured by corresponding blocks described in the above method embodiments, and will not be described in detail any more.

Compared with the related art, in one embodiment of the present disclosure, a gate pattern layer may be formed on a substrate; a gate insulating layer covering the gate pattern layer may be formed; semi-conductive oxide material may be deposited on the gate insulating layer to form an active pattern layer; reducing material may be deposited on the active pattern layer to form a reducing pattern layer; and a source pattern layer and a drain pattern layer may be formed on the reducing pattern layer. In this way, the reducing material in the reducing pattern layer may be combined with the weak-oxygen bonds on the surfaces of the back channels of the active pattern layer formed by semi-conductive oxides, and the electrons in the reducing material may be transited to the surfaces of the active pattern layer and thus an electron accumulation layer is formed. Therefore, the level defects of the back channels of the active pattern layer may be reduced, and the mobility may be improved.

The descriptions above are merely the embodiments of the present disclosure, and are not intended to limit the protection scope of the present disclosure. In fact, one skilled in the art may make many equivalents and modifications based on the specification and the drawings of the present disclosure, or directly or indirectly apply the technical solution to other relevant technical field. All these shall all be covered within the protection of the disclosure.

What is claimed is:

1. A thin-film transistor, comprising:
a gate pattern layer, formed on a substrate and directly contacting the substrate;
a gate insulating layer covering the gate pattern layer;
an active pattern layer formed on the gate insulating layer, wherein the active pattern layer comprises a first semi-conductive pattern layer and two second semi-conductive pattern sub-layers, the two second semi-conductive pattern sub-layers are arranged at two opposite sides of the first semi-conductive pattern sub-layer and adjacent to the first semi-conductive pattern sub-layer;
a reducing pattern layer, formed on the active pattern layer and patterned to form a first reducing pattern sub-layer and a second reducing pattern sub-layer disconnected from each other; and
a source pattern layer and a drain pattern layer, wherein the first reducing pattern sub-layer is arranged between the source pattern layer and one of the two second semi-conductive pattern sub-layers, the second reducing pattern sub-layer is arranged between the drain pattern layer and the other one of the two second semi-conductive pattern sub-layers, and the reducing pattern layer is configured to reduce level defects of back channels of the active pattern layer and improve electron mobility.

2. The thin-film transistor as described in claim 1, wherein a reducing material of the reducing pattern layer comprises kalium or calcium.

3. The thin-film transistor as described in claim 1, wherein each of the first semi-conductive pattern sub-layer and the two second semi-conductive pattern sub-layers is arranged to contact at least a part of the gate insulating layer.

4. The thin-film transistor as described in claim 3, the first reducing pattern sub-layer is directly connected to the source pattern layer and one of the two second semi-conductive pattern sub-layers, and the second reducing pattern sub-layer is directly connected to the drain pattern layer and the other one of the two second semi-conductive pattern sub-layers.

5. The thin-film transistor as described in claim 4, wherein an area ratio of each reducing pattern sub-layer to each second semi-conductive pattern sub-layer is in a range of $1/2$-$3/4$.

* * * * *

UNITED STATES PATENT AND TRADEMARK OFFICE
CERTIFICATE OF CORRECTION

PATENT NO. : 10,818,801 B2  
APPLICATION NO. : 15/967195  
DATED : October 27, 2020  
INVENTOR(S) : Qianyi Zhang Page 1 of 1

It is certified that error appears in the above-identified patent and that said Letters Patent is hereby corrected as shown below:

In the Claims

In Column 8, Claim 4, Line 15, insert --wherein-- between "3," and "the".

Signed and Sealed this  
Twenty-second Day of December, 2020

Andrei Iancu  
*Director of the United States Patent and Trademark Office*